United States Patent
Fujisawa et al.

(10) Patent No.: US 8,586,286 B2
(45) Date of Patent: Nov. 19, 2013

(54) RESIN COMPOSITION FOR OPTICAL WAVEGUIDE, AND OPTICAL WAVEGUIDE PRODUCED BY USING THE RESIN COMPOSITION

(75) Inventors: Junichi Fujisawa, Ibaraki (JP); Tomoyuki Hirayama, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 141 days.

(21) Appl. No.: 13/286,830

(22) Filed: Nov. 1, 2011

(65) Prior Publication Data

US 2012/0114294 A1    May 10, 2012

(30) Foreign Application Priority Data

Nov. 5, 2010   (JP) ................................. 2010-248502

(51) Int. Cl.
- *G02B 6/10* (2006.01)
- *C08F 2/50* (2006.01)
- *G03F 7/004* (2006.01)

(52) U.S. Cl.
USPC .......................................... 430/321; 385/123

(58) Field of Classification Search
None
See application file for complete search history.

(56) References Cited

U.S. PATENT DOCUMENTS 7,394,965 B2 *   7/2008   Utaka et al. ................... 385/141

FOREIGN PATENT DOCUMENTS

| JP | 2002-145984 | * | 5/2002 |
| JP | 2004-151456 | * | 5/2004 |
| JP | 2005-115187 | * | 4/2005 |
| JP | 2005-338202 A | | 12/2005 |
| JP | 2009-269954 | * | 11/2009 |

OTHER PUBLICATIONS

Kagawa webpage (6 pages in Japanese and 7 pages in English (13 total), public disclosure in 2005).*

* cited by examiner

*Primary Examiner* — Martin Angebranndt
(74) *Attorney, Agent, or Firm* — Westerman, Hattori, Daniels & Adrian, LLP

(57) ABSTRACT

A resin composition for an optical waveguide is provided, which permits easy formation of a core pattern using an alkali developing liquid and suppresses degradation of the alkali developing liquid. An optical waveguide produced by using the resin composition is provided. The resin composition comprises: (A) an alkali soluble resin, as a major component, having a structural unit represented by formula (1):

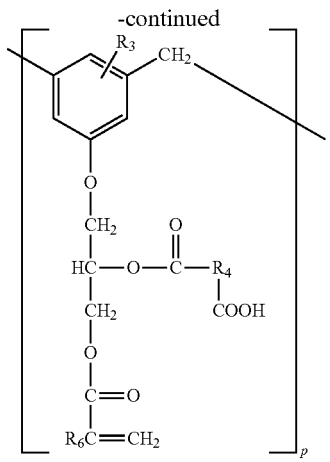

wherein $R_1$, $R_2$ and $R_3$, which may be the same or different, are each a hydrogen atom or a methyl group; $R_5$ and $R_6$, which may be the same or different, are each a hydrogen atom or a methyl group; $R_4$ is

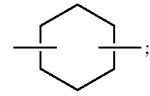

;

and $m+n+p=1$, $m>0$, $n>0$ and $p>0$; and (B) a photopolymerization initiator. The optical waveguide includes a substrate, a cladding layer provided thereon, and a core portion provided in the cladding layer for transmitting an optical signal.

2 Claims, 2 Drawing Sheets

RESIN COMPOSITION FOR OPTICAL WAVEGUIDE, AND OPTICAL WAVEGUIDE PRODUCED BY USING THE RESIN COMPOSITION

BACKGROUND OF THE INVENTION

1. Field of the Invention

The present invention relates to a resin composition to be used as a material for a core portion of an optical waveguide, and to an optical waveguide produced by using the resin composition. More specifically, the present invention relates to a resin composition which permits easy formation of a core pattern in an optical waveguide with the use of an alkali developing liquid, and to an optical waveguide produced by using the resin composition.

2. Description of the Related Art

Optical waveguides are typically incorporated in optical devices such as optical waveguide devices, optical integrated circuits and optical wiring boards to be widely used for optical communications, optical information processing and other general optics. Such an optical waveguide typically includes cores of a predetermined pattern provided as light paths, and an under-cladding layer and an over-cladding layer covering the cores.

Where the cores, the under-cladding layer and the over-cladding layer are formed in predetermined patterns, various materials are generally usable. For example, a photosensitive polymer material is used for forming the cores in the predetermined pattern. The formation of the cores is achieved in the following manner. A coating layer of the photosensitive polymer material is formed on the under-cladding layer, and irradiated with ultraviolet radiation via a patterning film for exposure. Then, an unexposed portion of the coating layer is removed with a solvent. Thus, the coating layer is patterned to form the cores in the predetermined pattern. This core formation method is easy and less expensive, but uses the solvent for the patterning, thereby posing a problem associated with working safety and environmental load.

To cope with this problem, a photo-curable and thermo-curable resin composition containing an alkali soluble resin, an photopolymerization initiator and an epoxy resin has been developed as an alkali developable optical waveguide material, which is used as a core material to form the core pattern by using an alkali developing liquid instead of the solvent (see JP-A-2005-338202).

After the core pattern is formed by using the alkali developable optical waveguide material (photo-curable and thermo-curable resin composition), a carboxyl group (acid functional group) in the alkali soluble resin and an epoxy group in the epoxy resin are esterified through thermosetting for improvement of reliability characteristics such as heat resistance and moisture resistance.

However, the epoxy resin in the photo-curable and thermo-curable resin composition disclosed in JP-A-2005-338202 does not have the carboxyl group (acid functional group) and, therefore, is insoluble in the alkali developing liquid. After the development, the alkali developing liquid is liable to contain insoluble suspended and precipitated substances and, therefore, is poorer in use efficiency, thereby reducing the mass-productivity with a difficulty in the quality control thereof. If the alkali developing liquid containing the insoluble suspended and precipitated substances is continuously used for the development, the suspended substances are liable to adhere again to a surface of the core pattern, making it impossible to properly configure the core pattern.

A resin composition is provided which permits easy formation of the core pattern of the optical waveguide by using the alkali developing liquid and suppresses degradation of the alkali developing liquid for improvement of the productivity, and to provide an optical waveguide produced by using the resin composition.

SUMMARY OF THE INVENTION

According to a first aspect, there is provided a resin composition for an optical waveguide, the resin composition comprising:

(A) an alkali soluble resin, as a major component, having a structural unit represented by the following general formula (1):

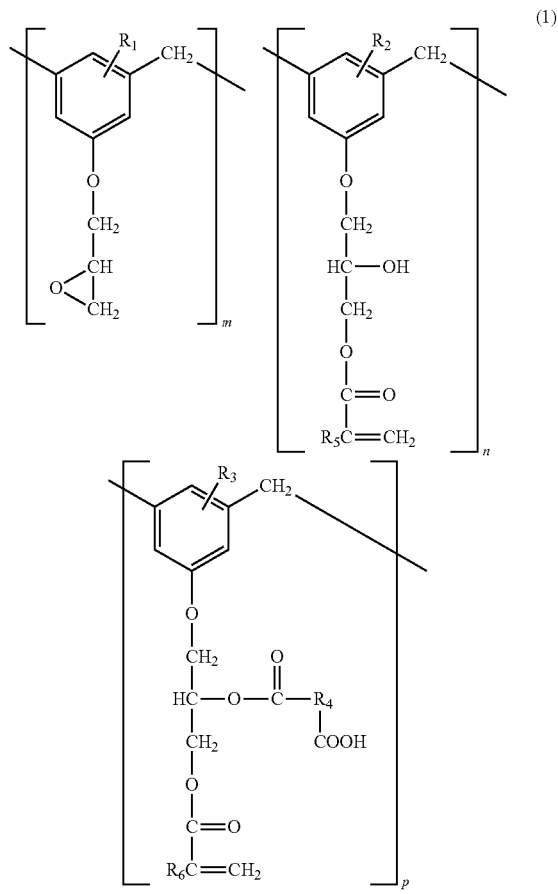

wherein $R_1$, $R_2$ and $R_3$, which may be the same or different, are each a hydrogen atom or a methyl group; $R_5$ and $R_6$, which may be the same or different, are each a hydrogen atom or a methyl group; $R_4$ is

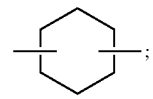

and $m+n+p=1$, $m>0$, $n>0$ and $p>0$; and (B) a photopolymerization initiator.

According to a second aspect, there is provided an optical waveguide, which comprises a substrate, a cladding layer provided on the substrate, and a core portion provided in the cladding layer for transmitting an optical signal, wherein the core portion is formed from the resin composition according to the first aspect.

If a compound having a (meth)acryloyl group, a carboxyl group, an epoxy group and a hydroxyl group in the same molecule is used for a resin composition, the resin composition is free from the aforementioned problem without generation of the insoluble substances. If the alkali soluble resin having the specific structural unit represented by the general formula (1), i.e., having the (meth)acryloyl group, the carboxyl group, the epoxy group and the hydroxyl group in the same molecule, is used as a constituent of the resin composition for the optical waveguide, the alkali developing liquid is free from the insoluble suspended and precipitated substances, and the optical waveguide produced by using the resin composition includes a properly configured core pattern without the problem such that the insoluble substances adhere again to a surface of the core pattern.

As described above, the resin composition comprises the specific alkali soluble resin (A), as the major component, having the structural unit represented by the above general formula (1), and the photopolymerization initiator (B) for curing the alkali soluble resin. An optical waveguide is produced by using the resin composition for formation of the core portion. Therefore, the resin composition improves the use efficiency of the developing liquid without the generation of the insoluble substances during the development with the alkali developing liquid, thereby improving the mass-productivity of the optical waveguide with the proper quality control of the developing liquid. Since the core portion of the optical waveguide is formed from the resin composition, the core pattern is properly configured without the adhesion of the insoluble substances to the surface of the core pattern after the development with the alkali developing liquid. As a result, the optical waveguide produced by using the resin composition is highly reliable.

DETAILED DESCRIPTION OF THE INVENTION

Figure 1:
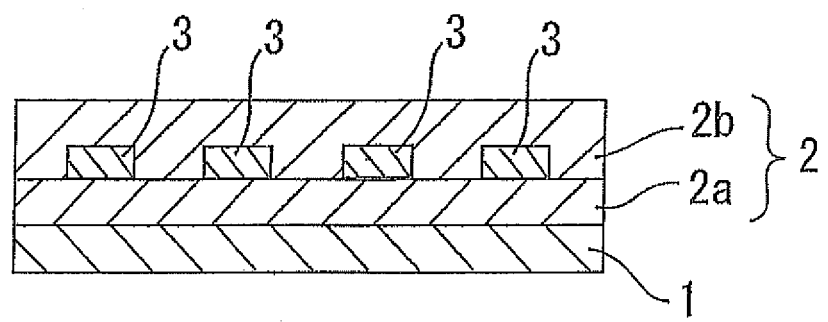
FIG. 1 is a cross sectional view illustrating an exemplary optical waveguide.

The present invention will hereinafter be described by way of embodiments thereof.

<<Resin Composition for Optical Waveguide>>

A resin composition for an optical waveguide is prepared by using an alkali soluble resin (A), as a major component, having a specific structural unit and a photopolymerization initiator (B).

The alkali soluble resin (A) having the specific structural unit is a resin having a structural unit represented by the following general formula (1):

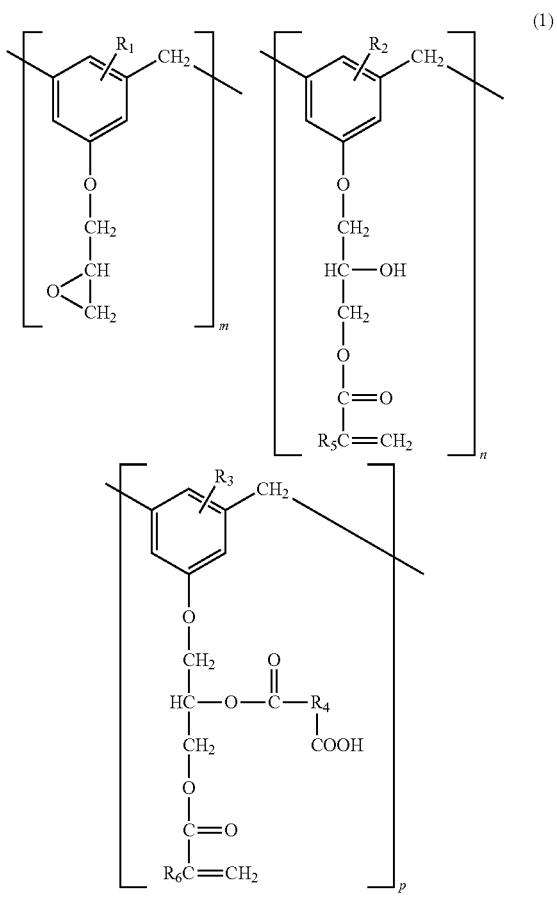

wherein $R_1$, $R_2$ and $R_3$, which may be the same or different, are each a hydrogen atom or a methyl group; $R_5$ and $R_6$, which may be the same or different, are each a hydrogen atom or a methyl group; $R_4$ is

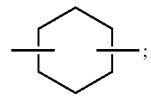

and $m+n+p=1$, $m>0$, $n>0$ and $p>0$.

That is, the alkali soluble resin (A) having the specific structural unit is a resin having a (meth)acryloyl group, a carboxyl group, an epoxy group and a hydroxyl group in the same molecule. It is particularly preferred that $R_1$ to $R_3$ are each a methyl group, and $R_5$ and $R_6$ are each a hydrogen atom in the general formula (1). In the structural unit represented by the above general formula (1), repeating units m, n, p may be block-polymerized or random-polymerized. It is particularly preferred that the repeating units are block-polymerized. Specific examples of the alkali soluble resin (A) having the specific structural unit are ENC materials available from Kagawa Chemical Ltd.

Where the alkali soluble resin (A) having the aforementioned specific structural unit is used for the optical waveguide, the photopolymerization initiator (B) is used in order to impart the resin composition with UV-curability.

Examples of the photopolymerization initiator (B) include benzoins, benzoin alkyl ethers, acetophenones, aminoacetophenones, anthraquinones, thioxanthones, ketals, benzophenones, xanthones and phosphine oxides. Specific examples of the photopolymerization initiators include IRGACURE 651, IRGACURE 184, IRGACURE 1173, IRGACURE 500, IRGACURE 2959, IRGACURE 127, IRGACURE 754, IRGACURE MBF, IRGACURE 907, IRGACURE 369, IRGACURE 379, IRGACURE 819, IRGACURE 1800, DAROCURE TPO, DAROCURE 4265, IRGACURE OXE01, IRGACURE OXE02, IRGACURE 250 and DAROCURE EHA. These photopolymerization initiators may be used either alone or in combination. In addition to the photopolymerization initiator, a latent curing agent such as a trifluoroboron-amine complex, dicyandiamide (DICY) or its derivative, an organic acid hydrazide, diaminomaleonitrile (DAMN) or its derivative, melamine or its derivative, guanamine or its derivative, an aminimide (AI) or a polyamine salt may be blended in the resin composition.

The photopolymerization initiator (B) is preferably blended in a proportion of 0.1 to 20 wt %, particularly preferably 0.5 to 10 wt %, based on the solid weight of the resin composition (excluding the weight of a solvent component). If the proportion is excessively small, it is difficult to ensure sufficient photo-curability. If the proportion is excessively great, it is impossible to provide a proper pattern configuration.

In addition to the alkali soluble resin (A) and the photopolymerization initiator (B), as required, the resin composition for the optical waveguide may contain a silane coupling agent or a titanium coupling agent for improvement of adhesiveness, an olefin oligomer or a cycloolefin oligomer or polymer such as a norbornene oligomer, a flexibility imparting compound such as a synthetic rubber or a silicone compound, an antioxidant, a defoaming agent, or other additive. Any of these additives may be blended in the inventive resin composition, as long as the effects of are not impaired.

<<Production of Optical Waveguide>>

Next, an optical waveguide produced by using the resin composition for formation of core portions thereof will be described.

The optical waveguide includes, for example, a substrate, a cladding layer provided on the substrate, and core portions provided in a predetermined pattern in the cladding layer for transmitting optical signals. More specifically, as shown in FIG. 1, the optical waveguide includes, a substrate 1, a cladding layer 2 (including an under-cladding layer 2a and an over-cladding layer 2b) provided on the substrate 1, and core portions 3 provided in a predetermined pattern in the cladding layer 2 for transmitting optical signals. The core portions 3 are formed from the resin composition which contains the alkali soluble resin (A) having the specific structural unit and the photopolymerization initiator (B). In the optical waveguide, the cladding layer 2 is required to have a lower refractive index than the core portions 3.

Figure 2A:
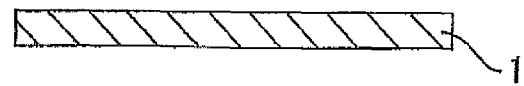
FIGS. 2A to 2F are diagrams for explaining a process for producing the optical waveguide.
Figure 2B:
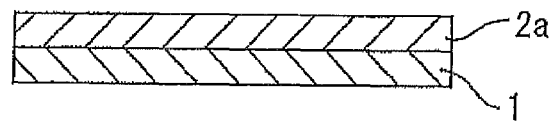
Figure 2C:
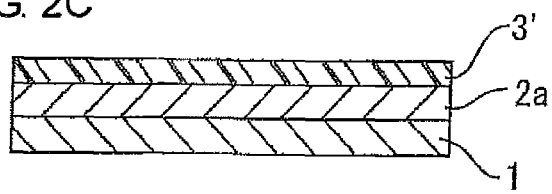

The optical waveguide can be produced through process steps shown in FIGS. 2A to 2F. As shown in FIG. 2A, the substrate 1 is first prepared. Then, as shown in FIG. 2B, a varnish of an under-cladding layer material is applied on a surface of the substrate 1, and irradiated with ultraviolet radiation or the like and then heat-treated, whereby the under-cladding layer 2a (a lower portion of the cladding layer 2) is formed. In turn, as shown in FIG. 2C, a varnish of the resin composition for formation of the core portions 3 is applied on the under-cladding layer 2a to form a resin composition layer 3'. The application of the varnish is achieved, for example, by a spin coating method, a dipping method, a casting method, an injection method, an ink jet method or a roll coating method. Where the varnish is prepared by diluting the resin composition with an organic solvent, a drying step may be performed, as required, to heat-treat the applied varnish at 50° C. to 150° C. for 1 to 30 minutes.

Figure 2D:
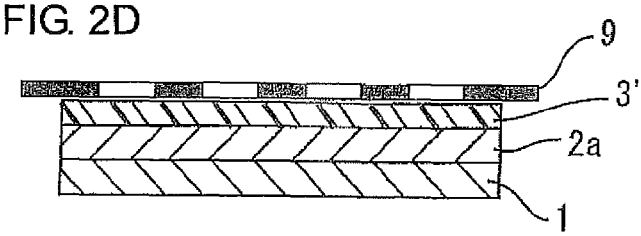

Subsequently, as shown in FIG. 2D, a photomask 9 formed with a predetermined opening pattern (optical waveguide pattern) which conforms to the core pattern is placed on a surface of the resin composition layer 3'. Then, portions of the resin composition layer 3' which conform to the opening pattern are exposed to radiation via the photomask 9. In the exposure, the radiation is applied to the resin composition layer 3' perpendicularly to the resin composition layer 3', whereby the exposed portions are cured through a photoreaction. Thereafter, an unexposed portion of the resin composition layer 3' is dissolved away with the use of an alkali developing liquid.

After the development with the alkali developing liquid, the core portions thus patterned are rinsed for removal of salts remaining in and on the core portions. Usable as a rinse liquid for the rinsing are tap water, ion-exchanged water, an aqueous solution of a surface active agent, an acidic aqueous solution and an organic solvent.

Figure 2E:
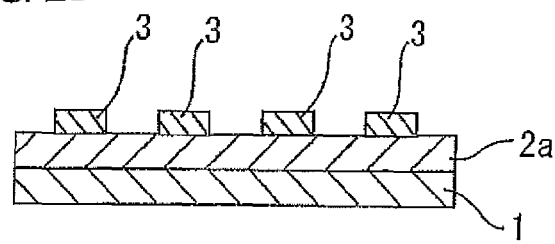

Thereafter, the resulting core portions are further thermally cured through a heat treatment. The heat treatment is typically performed at 120° C. to 200° C. for 1 to 60 minutes. Thus, as shown in FIG. 2E, the core portions 3 are formed by patterning. The core portions 3 typically each have a thickness of 10 to 150 μm, preferably 30 to 60 μm. The core portions 3 typically each have a width of 8 to 70 μm, preferably 30 to 60 μm.

Figure 2F:
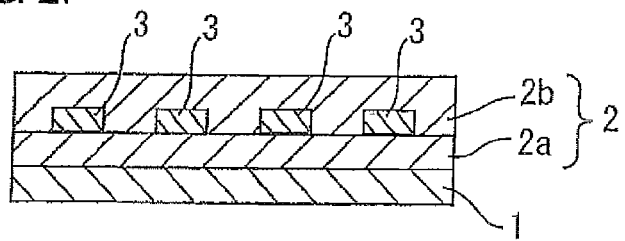

Subsequently, as shown in FIG. 2F, a varnish of an over-cladding layer material, which is the same as the varnish of the under-cladding layer material, is applied over the core portions 3, and then irradiated with ultraviolet radiation or the like and further heat-treated, whereby the over-cladding layer 2b (an upper portion of the cladding layer 2) is formed. Thus, the intended optical waveguide is produced.

Exemplary materials for the substrate 1 include polymer films and glass substrates. Specific examples of the polymer films include polyethylene terephthalate (PET) films, polyethylene naphthalate films and polyimide films. The substrate 1 typically has a thickness of 10 μm to 3 mm.

Examples of the radiation to be used for the exposure include visible radiation, ultraviolet radiation, infrared radiation, X-ray, α-ray, β-ray and γ-ray. Particularly, the ultraviolet radiation is preferred, which permits irradiation with a higher energy for a higher curing rate. In addition, a device for the irradiation with the ultraviolet radiation generally has a smaller size and is less expensive, thereby reducing the production costs. Exemplary light sources for emitting the ultraviolet radiation include a low pressure mercury lamp, a high pressure mercury lamp, an ultrahigh pressure mercury lamp, a xenon lamp, a metal halide lamp, a mercury vapor arc lamp and a carbon arc lamp. The dose of the ultraviolet radiation is typically about 10 to about 10000 mJ/cm$^2$, preferably about 50 to about 5000 mJ/cm$^2$, more preferably about 500 to about 3000 mJ/cm$^2$.

After the exposure, a heat treatment is typically performed at 80° C. to 250° C. for 10 seconds to 2 hours, preferably at 100° C. to 150° C. for 5 minutes to 1 hour, for completion of the photoreaction.

The ultrahigh pressure mercury lamp or the high pressure mercury lamp is typically used for the irradiation with the radiation (ultraviolet radiation) via the photomask in the photolithography process. However, these light sources are not adapted to emit light at a single wavelength, but are adapted to emit radiation such as g-line, h-line and i-line at a plurality of wavelengths. On the other hand, it is known that the photolithography process is improved in resolution and image formation quality by irradiation with radiation having a limited wavelength range rather than by irradiation with broadband light having a plurality of wavelengths, depending on the type of the photosensitive resin. Particularly, where the broadband light is used for curing an epoxy material or an oxetane material through photo-cation polymerization or for curing an acryl material through photoradical polymerization, a so-called T-top phenomenon occurs, in which a surface portion of a film of the material is preferentially cured by irradiation with the broadband light and an upper portion of a pattern has a greater width as seen in cross-section. Due to the T-top phenomenon, the resulting optical waveguide has an uneven width, i.e., a smaller width on its lower side (on a substrate side) and a greater width on its upper side (on an outer surface side), as seen in cross-section.

Therefore, an exposure filter called "band-pass filter" is preferably used for the irradiation with the radiation (ultraviolet radiation) via the photomask, so that only the intended exposure radiation suitable for the core material can be applied onto the core material for improvement of the resolution of the core pattern. A core pattern actually formed from some core material suffers from thickening or thinning to have dimensions deviated from the designed dimensions of the photomask due to curing shrinkage, other volumetric contraction or scattering of the radiation (ultraviolet radiation) or for other process-related reasons. Therefore, it is desirable to multiply the size of the photomask by a correction factor, so that the core pattern can be formed as having dimensions within a desired dimensional range.

Usable as the alkali developing liquid for the removal of the unexposed portion is an organic or inorganic alkaline aqueous solution, an alkaline semi-aqueous developing liquid containing the alkaline aqueous solution and at least one organic solvent. The developing liquid and conditions for the development are properly selected depending on the resin composition to be developed. Exemplary bases of the alkaline aqueous solution include: alkali metal hydroxides such as lithium hydroxide, sodium hydroxide and potassium hydroxide; alkali metal carbonates such as lithium carbonate, sodium carbonate and potassium carbonate; alkali metal bicarbonates such as lithium hydrogen carbonate, sodium hydrogen carbonate and potassium hydrogen carbonate; alkali metal phosphates such as potassium phosphate and sodium phosphate; alkali metal pyrophosphates such as sodium pyrophosphate and potassium pyrophosphate; sodium salts such as sodium tetraborate and sodium metasilicate; ammonium salts such as ammonium carbonate and ammonium hydrogen carbonate; and organic bases such as tetramethylammonium hydroxide, triethanolamine, ethylenediamine and diethylenetriamine. Examples of the organic solvent include alcohols such as methanol, ethanol, isopropanol, butanol, ethylene glycol, propylene glycol and diethylene glycol.

The substrate 1 may be separated from the optical waveguide thus produced to provide a film-shaped optical waveguide. The film-shaped optical waveguide is further excellent in flexibility.

The optical waveguide thus produced is usable as an optical waveguide for a wiring circuit board to be provided in a hinge portion of a mobile device such as a mobile phone.

EXAMPLES

The present invention will hereinafter be described by way of examples thereof. However, it should be understood that the present invention be not limited to these examples.

Example 1

<Core Material (Resin Composition for Optical Waveguide)>

First, 100 parts by weight of a propylene glycol monomethyl ether acetate (PGMAC) solution containing an alkali soluble resin having an acrylate group, a carboxyl group, an epoxy group and a hydroxyl group in the same molecule at a concentration of 60 wt % (ENC available from Kagawa Chemical Ltd., and having a solid acid value of 31.9 mg KOH/g and having a structural unit represented by the above general formula (1) wherein m is 0.3, n is 0.4, p is 0.3, $R_1$ to $R_3$ are each a methyl group, and $R_5$ and $R_6$ are each a hydrogen atom), and 3.6 parts by weight of IRGACURE 184 (available from BASF Ltd.) and 1.2 parts by weight of IRGACURE 819 (available from BASF Ltd.) as a photopolymerization initiator were mixed together by stirring for 30 minutes by means of a hybrid mixer (HM-500 available from Keyence Corporation). Thus, a core material (resin composition for optical waveguide) was prepared.

Example 2

<Core Material (Resin Composition for Optical Waveguide)>

A core material (resin composition for optical waveguide) was prepared in substantially the same manner as in Example 1, except that a PGMAC solution containing an alkali soluble resin having an acrylate group, a carboxyl group, an epoxy group and a hydroxyl group in the same molecule at a concentration of 60 wt % (ENC available from Kagawa Chemical Ltd., and having a solid acid value of 55.7 mg KOH/g and having a structural unit represented by the above general formula (1) wherein m is 0.3, n is 0.1, p is 0.6, $R_1$ to $R_3$ are each a methyl group, and $R_5$ and $R_6$ are each a hydrogen atom) was used instead of the PGMAC solution of the 60 wt % alkali soluble resin of Example 1.

Example 3

<Core Material (Resin Composition for Optical Waveguide)>

A core material (resin composition for optical waveguide) was prepared in substantially the same manner as in Example 1, except that a PGMAC solution containing an alkali soluble resin having an acrylate group, a carboxyl group, an epoxy group and a hydroxyl group in the same molecule at a concentration of 60 wt % (ENC available from Kagawa Chemical Ltd., and having a solid acid value of 22.9 mg KOH/g and having a structural unit represented by the above general formula (1) wherein m is 0.4, n is 0.4, p is 0.2, $R_1$ to $R_3$ are each a methyl group, and $R_5$ and $R_6$ are each a hydrogen atom) was used instead of the PGMAC solution of the 60 wt % alkali soluble resin of Example 1.

Comparative Example 1

<Core Material (Resin Composition for Optical Waveguide)>
Component 1: 86 parts by weight of a PGMAC solution containing an epoxy methacrylate resin modified with a carboxylic anhydride (EA-7440 available from Shin-Nakamura Chemical Co., Ltd., and having a solid acid value of 80 mg KOH/g)
Component 2: 14 parts by weight of a difunctional epoxy resin of bisphenol-A type (EPICOAT 828 available from Mitsubishi Chemical Corporation)
Polymerization initiator: 3.0 parts by weight of IRGACURE 184 (available from BASF Ltd.) and 1.0 part by weight of IRGACURE 819 (available from BASF Ltd.)

The above components were mixed together by stirring for 10 minutes by means of a hybrid mixer (HM-500 available from Keyence Corporation). Thus, a core material (resin composition for optical waveguide) was prepared.

Comparative Example 2

<Core Material (Resin Composition for Optical Waveguide)>
Component 1: 86 parts by weight of a PGMAC solution containing an epoxy methacrylate resin modified with a carboxylic anhydride (EA-7440 available from Shin-Nakamura Chemical Co., Ltd., and having an acid value of 80 mg KOH/g)
Component 2: 14 parts by weight of a monofunctional epoxy resin (DENACOL EX-145 available from Nagase ChemteX Corporation)
Polymerization initiator: 3.0 parts by weight of IRGACURE 184 (available from BASF Ltd.) and 1.0 part by weight of IRGACURE 819 (available from BASF Ltd.)

The above components were mixed together by stirring for 10 minutes by means of a hybrid mixer (HM-500 available from Keyence Corporation). Thus, a core material (resin composition for optical waveguide) was prepared.

Comparative Example 3

<Core Material (Resin Composition for Optical Waveguide)>
Component 1: 86 parts by weight of a PGMAC solution containing an epoxy methacrylate resin modified with a carboxylic anhydride (EA-7440 available from Shin-Nakamura Chemical Co., Ltd., and having an acid value of 80 mg KOH/g)
Component 2: 14 parts by weight of a monofunctional epoxy resin (DENACOL EX-146 available from Nagase ChemteX Corporation)
Polymerization initiator: 3.0 parts by weight of IRGACURE 184 (available from BASF Ltd.) and 1.0 part by weight of IRGACURE 819 (available from BASF Ltd.)

The above components were mixed together by stirring for 10 minutes by means of a hybrid mixer (HM-500 available from Keyence Corporation). Thus, a core material (resin composition for optical waveguide) was prepared.

The core materials (resin compositions for optical waveguide) thus prepared were evaluated for the following characteristic properties by the following evaluation methods. The results are shown below in Tables 1 and 2.

<Evaluation Methods>

The core materials thus prepared were each applied to a thickness of about 50 μm on a 12-cm long glass substrate by means of a spin coater, and then heated at 100° C. for 10 minutes for removal of the organic solvent from the material. Thus, the glass substrate was formed with an uncured resin composition film. Then, the uncured resin composition film was evaluated in the following manner for alkali developability.

A liquid mixture containing an aqueous solution of 2.38 wt % tetramethylammonium hydroxide (TMAH) (ZTMA100 available from Nippon Zeon corporation) and an alcohol (a mixture containing ethanol and methanol in a weight ratio of 89/11 and available under EKINEN F-6 from Japan Alcohol Trading Co., Ltd.) in a weight ratio of 50/50 was prepared and heated up to about 35° C. Then, the glass substrate formed with the uncured core resin composition film was immersed in 100 g of the liquid mixture for 4 minutes, and visually observed to check: (1) a change in the color of the developing liquid; and (2) the developed state of the uncured core resin composition film. A plurality of glass substrates (five glass substrates) each formed with the uncured core resin composition film were successively immersed in the same developing liquid for first to fifth development operations and, after the first to fifth development operations were each performed, the change in the color of the developing liquid and the developed state of the uncured core resin composition film were checked. Then, the uncured resin composition films were evaluated based on the following criteria.

<Evaluation of Change in Color of Developing Liquid>
○: The developing liquid was transparent.
×: The developing liquid was turbid in white.

<Evaluation of Developed State of Uncured Core Resin Composition Film>
○: The uncured core resin composition film was completely dissolved away.
×: The uncured core resin composition film was partly left undissolved.

TABLE 1

|  | Example 1 | Example 2 | Example 3 | Comparative Example 1 | Comparative Example 2 | Comparative Example 3 |
|---|---|---|---|---|---|---|
| Evaluation of color of developing liquid | | | | | | |
| Before development | ○ | ○ | ○ | ○ | ○ | ○ |
| After first development | ○ | ○ | ○ | ○ | ○ | × |
| After second development | ○ | ○ | ○ | × | × | × |
| After third development | ○ | ○ | ○ | × | × | × |
| After fourth development | ○ | ○ | ○ | × | × | × |
| After fifth development | ○ | ○ | ○ | × | × | × |

TABLE 2

|  | Example 1 | Example 2 | Example 3 | Comparative Example 1 | Comparative Example 2 | Comparative Example 3 |
|---|---|---|---|---|---|---|
| Evaluation of developed state of uncured core resin composition film | | | | | | |
| Before development | ○ | ○ | ○ | ○ | ○ | ○ |
| After first | ○ | ○ | ○ | ○ | ○ | ○ |

TABLE 2-continued

|  | Example 1 | Example 2 | Example 3 | Comparative Example 1 | Comparative Example 2 | Comparative Example 3 |
|---|---|---|---|---|---|---|
| Evaluation of developed state of uncured core resin composition film | | | | | | |
| development | | | | | | |
| After second development | ○ | ○ | ○ | ○ | ○ | ○ |
| After third development | ○ | ○ | ○ | ○ | ○ | ○ |
| After fourth development | ○ | ○ | ○ | x | ○ | ○ |
| After fifth development | ○ | ○ | ○ | x | ○ | ○ |

The above results indicate that, in Examples 1 to 3 employing the alkali soluble resins each having the specific structural unit, the developing liquids were kept transparent without white turbidity even after the second and subsequent development operations, and the uncured core resin composition films were completely dissolved away without residue even in the fifth development operation. In Comparative Examples 1 to 3 each employing the epoxy acrylate resin modified with the carboxylic anhydride and the epoxy resin in combination, on the other hand, the developing liquid became turbid in white during the first development operation (Comparative Example 3), and the developing liquids became turbid in white during the second development operation (Comparative Examples 1 and 2). In Comparative Example 1, the uncured core resin composition film was left undissolved in the fourth development operation.

<Production of Optical Waveguide>

A core material (resin composition for optical waveguide) was prepared in the same manner as in Example 1, and an under-cladding layer material and an over-cladding layer material were prepared in the following manner. By using these materials, an optical waveguide (see FIG. 1) was produced through the following process steps (see FIGS. 2A to 2F).

<Under-Cladding Layer Material and Over-Cladding Layer Material>

First, 50 parts by weight of a propylene glycol monomethyl ether acetate (PGMAC) solution containing an alkali soluble resin having an acrylate group, a carboxyl group, an epoxy group and a hydroxyl group in the same molecule at a concentration of 60 wt % (ENC available from Kagawa Chemical Ltd., and having a solid acid value of 31.9 mg KOH/g and having a structural unit represented by the above general formula (1) wherein m is 0.3, n is 0.4, p is 0.3, $R_1$ to $R_3$ are each a methyl group, and $R_5$ and $R_6$ are each a hydrogen atom), 50 parts by weight of a polyfunctional polyester acrylate (M-9050 available from Toagosei Co., Ltd.) and 1.5 parts by weight of IRGACURE E907 (available from BASF Ltd.) as a photopolymerization initiator were mixed together by stirring for 30 minutes by means of a hybrid mixer (HM-500 available from Keyence Corporation). Thus, a cladding layer material (resin composition for optical waveguide) was prepared.

<Formation of Under-Cladding Layer>

The under-cladding layer material was applied on a surface of a glass substrate (having a size of 120 mm square and a thickness of 1.1 mm and available from Central Glass Co., Ltd.) by means of a spin coater (1X-DX2 available from Mikasa Co., Ltd.), and then dried at 130° C. for 5 minutes. In turn, the under-cladding layer material was exposed to mixed radiation emitted from an ultrahigh pressure mercury lamp (USH-250D available from Ushio Inc.) at 4000 mJ/cm² by means of an exposure machine (MA-60F available from Mikasa Co., Ltd.)

<Formation of Core Portions>

Next, the core material was applied on a surface of the under-cladding layer by means of a spin coater (1X-DX2 available from Mikasa Co., Ltd.), and then dried at 130° C. for 5 minutes. Subsequently, a glass photomask having an opening pattern including 12 straight linear openings (L/S=50 µm/200 µm) each extending longitudinally thereof was placed on the resulting core material layer, which was in turn exposed to radiation emitted from an ultrahigh pressure mercury lamp (USH-250D available from Ushio Inc.) at 365 nm at 2000 mJ/cm² via the glass photomask from above the photomask by means of an exposure machine (MA-60F available from Mikasa Co., Ltd.) Then, a liquid mixture containing an aqueous solution of 2.38 wt % tetramethylammonium hydroxide (TMAH) (ZTMA100 available from Nippon Zeon Corporation) and an alcohol (a mixture containing ethanol and methanol in a weight ratio of 89/11 and available under EKINEN F-6 from Japan Alcohol Trading Co., Ltd.) in a weight ratio of 50/50 was heated up to about 35° C., and an unexposed portion of the core material layer was dissolved away in the liquid mixture through shaking development. Thereafter, the resulting core material layer was rinsed with an aqueous solution of 0.5 wt % sulfuric acid and then with ion-exchanged water, and then heat-treated at 150° C. for 30 minutes. Thus, core portions were formed. The core portions thus formed each had a width of 50 µm and a height of 50 µm as measured by means of a digital microscope (VHX-200 available from Keyence Corporation).

<Formation of Over-Cladding Layer>

Subsequently, the over-cladding layer material was applied over the core portions by a spin coating method to cover the core portions and laterally opposite edges of the under-cladding layer each extending longitudinally of the under-cladding layer. At this time, longitudinally opposite end faces of the core portions and the under-cladding layer were also covered with the over-cladding layer material. Thereafter, the over-cladding layer material was dried at 100° C. for 10 minutes, and then exposed to radiation emitted from an ultrahigh pressure mercury lamp (USH-250D available from Ushio Inc.) at 365 nm at 4000 mJ/cm² by means of an exposure machine (MA-60F available from Mikasa Co., Ltd.) Thus, the over-cladding layer was formed, and the optical waveguide was produced.

<Uncovering of End Faces of Optical Waveguide>

The optical waveguide thus produced was separated from the glass substrate to provide a film-shaped optical waveguide. The film-shaped optical waveguide was bonded to a dicing tape (UE-111AJ available from Nitto Denko Corporation). Longitudinally opposite end portions of the over-cladding layer were cut together with the core portions and the under-cladding layer at a cutting speed of 0.3 mm/sec by a blade (NBC-Z2050 available from Disco Corporation and having a size of 50.6×0.025×40 mm) by means of a dicing machine (DAD522 available from Disco Corporation) through a dicing process. Thus, the optical waveguide had a length (overall length) of 50 mm with the longitudinally opposite end faces (optical connection faces) of the respective core portions uncovered.

<Evaluation of Total Loss of Optical Waveguide>

Light emitted from a VCSEL light source OP250 available from Miki Inc. was collected by a multi-mode fiber (FFP-G120-0500 (50 μmφ MMF, NA=0.2) available from Miki Inc.), and inputted into a sample of the optical waveguide. Then, light outputted from the sample was collected by a lens (FH14-11 (magnification of 20, NA=0.4) available from Seiwa Optical Co., Ltd.), and received by an optical meter system (optical multi-power meter Q8221 available from Advantest Corporation) for analysis at 12 channels. As a result, the average total loss was 1.3 dB/5 cm (n=12).

The resin composition for the optical waveguide is useful as a material for cores of the optical waveguide. The optical waveguide produced by using the resin composition is usable for a signal transmission circuit to be provided in a hinge portion or a slidable portion of a mobile device such as a foldable mobile phone.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An optical waveguide, comprising:
    a substrate;
    a cladding layer provided on the substrate; and
    a core portion provided in the cladding layer for transmitting an optical signal;
    wherein the core portion is formed from a resin composition comprising:
    (A) an alkali soluble resin, having a structural unit represented by the following general formula (1):

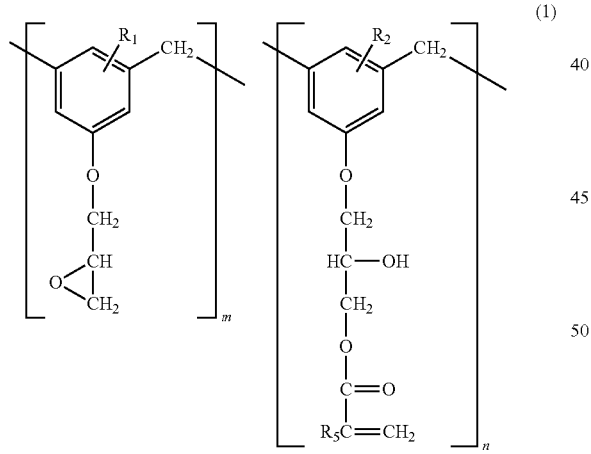

(1)

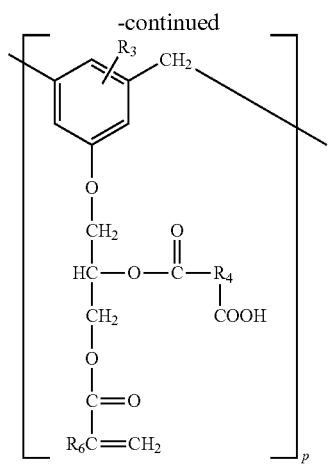

-continued wherein $R_1$, $R_2$ and $R_3$, which may be the same or different, are each a hydrogen atom or a methyl group;

wherein $R_5$ and $R_6$, which may be the same or different, are each a hydrogen atom or a methyl group;

wherein $R_4$ is

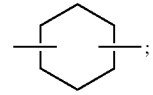

and wherein in the entirety of the alkali soluble epoxy resin (A), $m+n+p=1$, $m>0$, $n>0$ and $p>0$; and (B) a photopolymerization initiator.

2. The optical waveguide according to claim 1, wherein the photopolymerization initiator (B) is present in a proportion of 0.1 to 20 wt % based on a solid weight of the resin composition, excluding a weight of a solvent component.

* * * * *